United States Patent
Ellison

(10) Patent No.: US 10,128,427 B2
(45) Date of Patent: Nov. 13, 2018

(54) THERMOELECTRIC GENERATOR

(71) Applicant: Exnics Limited, Barrow-in-Furness, Lancashire (GB)

(72) Inventor: Stuart James Ellison, Barrow-in-Furness (GB)

(73) Assignee: EXNICS LIMITED, Lancashire (GB)

( * ) Notice: Subject to any disclaimer, the term of this patent is extended or adjusted under 35 U.S.C. 154(b) by 17 days.

(21) Appl. No.: 15/038,320

(22) PCT Filed: Nov. 14, 2014

(86) PCT No.: PCT/GB2014/053375
§ 371 (c)(1),
(2) Date: May 20, 2016

(87) PCT Pub. No.: WO2015/075426
PCT Pub. Date: May 28, 2015

(65) Prior Publication Data
US 2016/0293821 A1    Oct. 6, 2016

(30) Foreign Application Priority Data

Nov. 22, 2013 (GB) .................................. 1320657.8

(51) Int. Cl.
*H01L 35/30* (2006.01)
*H01L 35/32* (2006.01)
(Continued)

(52) U.S. Cl.
CPC ................ *H01L 35/32* (2013.01); *F03G 7/06* (2013.01); *H01L 35/02* (2013.01); *H01L 35/06* (2013.01); *H01L 35/30* (2013.01); *H01L 35/325* (2013.01)

(58) Field of Classification Search
CPC ................................ H01L 35/30; H01L 35/32
See application file for complete search history.

(56) References Cited

U.S. PATENT DOCUMENTS 2,702,828 A * 2/1955 Arvin ...................... H01L 35/32
136/225
3,615,869 A * 10/1971 Barker .................... G21H 1/103
136/202
(Continued)

FOREIGN PATENT DOCUMENTS

EP   2159855   3/2010
FR   2747238   10/1997

OTHER PUBLICATIONS

Engineering toolbox; Thermal conductivity of common materials and gases; http://www.engineeringtoolbox.com/thermal-conductivity-d_429.html; accessed and printed Jun. 14, 2017.*
(Continued)

*Primary Examiner* — Edward J. Schmiedel
(74) *Attorney, Agent, or Firm* — Meunier Carlin & Curfman LLC

(57) ABSTRACT

An apparatus for generating electricity. The apparatus comprises a collar arranged to couple to a pipe and a support having a first planar face, the support being attached to the collar such that it projects away from the collar. The apparatus also has at least one thermoelectric generator attached to the first planar face of the support and a cover attached to the at least one thermoelectric generator.

16 Claims, 3 Drawing Sheets

(51) Int. Cl.
   *H01L 35/06*   (2006.01)
   *H01L 35/02*   (2006.01)
   *F03G 7/06*    (2006.01)

(56)  References Cited

U.S. PATENT DOCUMENTS

| | | | | |
|---|---|---|---|---|
| 4,056,406 | A * | 11/1977 | Markman | H01L 35/06 |
| | | | | 136/208 |
| 5,741,116 | A | 4/1998 | Hudson | |
| 5,929,372 | A | 7/1999 | Oudoire et al. | |
| 6,073,449 | A * | 6/2000 | Watanabe | H01L 35/32 |
| | | | | 62/3.2 |
| 6,365,822 | B1 * | 4/2002 | Dobry, Jr. | B64G 1/422 |
| | | | | 136/202 |
| 6,894,215 | B2 * | 5/2005 | Akiba | H01L 35/30 |
| | | | | 136/204 |
| 2003/0140957 | A1 * | 7/2003 | Akiba | H01L 35/30 |
| | | | | 136/224 |
| 2005/0217714 | A1 | 10/2005 | Nishijima et al. | |
| 2010/0170551 | A1 | 7/2010 | Hiroyama et al. | |
| 2013/0213448 | A1 | 8/2013 | Moczygemba et al. | |

OTHER PUBLICATIONS

International Search Report and Written Opinion for PCT International Patent Application No. PCT/GB2014/053375, dated May 28, 2015.
Search Report conducted in corresponding GB Application No. 1320657.8, dated May 7, 2014.

* cited by examiner

THERMOELECTRIC GENERATOR

The present invention relates to an apparatus for generating electricity, the apparatus including a thermoelectric generator.

In recent years the offshore oil and gas industry has seen a clear trend for production facilities to be installed on the seabed, rather than on a rig or onshore. These subsea production facilities are particularly suited to more challenging environments including deep-sea and/or conditions in the arctic. These subsea production facilities can provide an efficient and economical subsea-to-beach solution which mitigates the need for a floating production unit or a fixed platform installation. There are several other advantages to installing process equipment close to the source of the product.

Process equipment has historically been powered from the surface. This is reliable but very costly. Power transmission cables for subsea production systems typically cost over $1,000,000 per mile and may be required to cover distances of 300 km or more.

Also, in many mature oil and gas basins around the world, including the North Sea, there are large numbers of smaller reservoirs that are beyond the reach of existing infrastructure. These smaller deposits or reservoirs of oil and/or gas are currently not economically viable. The cost of installing the necessary power distribution systems to power the process equipment needed to extract the oil and/or gas contributes to and/or hinders the economic viability of the reservoirs.

In order to reduce the cost of supplying power, an electrical generation system can be placed on or near the seabed. Maintenance of the electrical generation system is however then difficult or impossible. The inventor of the present invention has developed a subsea apparatus to reliably supply the necessary electrical power.

In accordance with a first aspect of the present invention there is provided an apparatus for generating electricity, the apparatus comprising:
  a collar arranged to couple to a pipe;
  a support having a first planar face, the support being attached to the collar such that it projects away from the collar; and
  at least one thermoelectric generator attached to the first planar face of the support.

The support may project radially away from the collar. The support may be substantially upstanding from the collar. The support is typically attached to the collar such that the first planar face of the support extends substantially perpendicular to the collar.

Each thermoelectric generator or module is typically substantially flat and therefore best suited to instalment on a substantially flat, not curved surface. The support may help to maximise the substantially flat surface area to which the at least one thermoelectric generator can be attached. The more or larger the thermoelectric generators, the more electricity the apparatus can generate.

The collar typically provides a means of attaching the apparatus to a substantially cylindrical object. The substantially cylindrical object is typically hollow. The substantially cylindrical object is typically one or more of a pipe, tube and conduit for the transportation of fluid. The collar normally provides a means of attaching the apparatus to an exterior surface of the pipe or conduit.

The support may have an inner circumferential edge. The collar may be attached to the inner circumferential edge of the support.

The apparatus of the present invention may be particularly suited to attachment to an existing pipe or conduit. The apparatus of the present invention may be particularly suited to attachment to a subsea or underwater pipe or conduit. The pipe or conduit may be standard, that is unmodified.

The fluid may be a liquid or a gas. The fluid may be crude oil or natural gas. The fluid may be produced fluid and/or gas. In use, the temperature of the fluid may be higher than the temperature of the environment surrounding the apparatus. The fluid may be warm or hot compared to the environment surrounding the apparatus. The temperature difference between the fluid and the surrounding environment may be from 0 to 400° C., optionally from 0 to 200° C. and normally from 0 to 100° C.

When the apparatus is installed on a pipe, in use, the temperature of the fluid in the pipe may be from 0 to 400° C. When the apparatus is installed on a pipe, in use, the temperature of the environment surrounding the apparatus may be from −50 to 50° C. When the apparatus is installed on a pipe, in use, the environment surrounding the apparatus may be sea water.

It may be an advantage of the present invention that the at least one thermoelectric generator is attached to the first planar face of the support. In use, the collar may increase the surface area of the apparatus that is in contact with the substantially cylindrical object. In use, heat from an outer surface of the substantially cylindrical object can be transferred to the collar and then from the collar to the support. In use, the collar may facilitate the transfer of heat from the substantially cylindrical object to the support. The collar may be a heat sink.

The support is typically a disk and/or disk shaped. The support is typically a hollow disk. The hollow disk may be referred to as a vane or radial vane. The support may be a split hollow disk. In an alternative embodiment the support may be a rib and/or rib shaped and may extend along the collar, in use, parallel to the longitudinal axis of the pipe.

The support may comprise at least two separable portions. The collar may comprise at least two separable portions. The at least two separable portions of the support and/or collar may be referred to as jaws or segments. The at least two separable portions of the support and/or collar may be one or more of hinged, welded, bolted and pinned together. In use, the support or at least two separable portions of the support and/or collar typically at least partially and may substantially fully envelop and/or surround a portion of pipe that the collar is attached to.

The jaw segments may have one or more of a curved 'T', 'L', 'U' and 'H' shaped cross-section.

The support may be attached to the collar using one or more of a bolt, hinge, weld or clamp.

The apparatus of the present invention is normally rigid, that is the collar and the support are rigid and/or rigidly connected together. The size and shape of the collar should be matched to the size and shape of the substantially cylindrical object that the apparatus is to be attached to. Any flexibility in the collar of the apparatus will typically reduce the efficiency with which the heat can be transferred between the substantially cylindrical object and the collar and so also the disc and thermoelectric generator.

The size and shape of the collar should be matched to the size and shape of the substantially cylindrical object that the apparatus is to be attached to ensure good conduction of heat between the collar and substantially cylindrical object.

There may be a layer of thermal insulation on an outer surface of the collar. In use, the thermal insulation typically reduces the transfer of heat away from the collar and/or between the collar and the surrounding environment. Instead, the heat from the outer surface of the substantially cylindrical object is transferred to the collar and then directed from the collar to the support, rather than being transferred from the collar to the surrounding environment.

The support may further comprise a second planar face. At least one thermoelectric generator may be attached to the second planar face of the support. The support is normally attached to the collar such that the first and second planar faces of the support extend substantially perpendicular to the collar. The first and second planar faces of the support are typically upstanding and/or project away from the collar.

The thermoelectric generator normally comprises a p-type semiconductor and an n-type semiconductor. The thermoelectric generator may be a Seebeck generator. The electricity may be generated by the thermoelectric generator using the Seebeck effect. Thermoelectric generator may be referred to as a thermoelectric generator module or the acronym TEG. The thermoelectric generator may comprise lead telluride and/or thallium-doped lead telluride.

The skilled reader will understand that a thermoelectric generator uses a temperature difference to generate electricity. To generate electricity there must therefore be a thermal gradient across the thermoelectric generator. The support normally provides a flat interface with a high thermal gradient. In use, a first side of the thermoelectric generator attached to the support will be relatively warm or hot. In use, a second opposed side of the thermoelectric generator will be exposed to the surrounding environment and will be relatively cool or cold. The warmth and/or heat for the warm side of the thermoelectric generator will typically be provided by the fluid in the pipe.

The cooling for the cool side of the thermoelectric generator will typically be provided by sea water surrounding the apparatus and/or in which the apparatus is immersed.

In use, warmth and/or heat for the warm side of the thermoelectric generator will typically flow across the thermoelectric generator to the cool side of the thermoelectric generator.

The apparatus of the present invention may provide a remote source of direct-current (DC) electrical power. The apparatus of the present invention may provide a solid state electrical generator that is robust and produces no emissions. The apparatus of the present invention may be used to provide electrical power to for example a flow meter, valve, pump, coalescer, acoustic modem, other control system and/or an instrument on a subsea Christmas tree.

The support and/or collar may comprise or be made of a material that has a high thermal conductivity. The thermal conductivity of the material may be from 20 to 500 $Wm^{-1}K^{-1}$. The material may comprise one or more of steel, aluminium, copper and an alloy thereof.

A cover is typically attached to the at least one thermoelectric generator and typically the second cool side of the at least one thermoelectric generator. The cover may be referred to as a bonnet. The bonnet may be a pressure-containing closure for the apparatus and/or support. The cover may protect the at least one thermoelectric generator. The cover may protect the at least one thermoelectric generator from the surrounding environment. The surrounding environment may be sea water.

When the cover is attached to the at least one thermoelectric generator, the cover is typically in contact with the at least one thermoelectric generator. When the cover is attached to the at least one thermoelectric generator, the cover may be attached and/or secured to the support.

In use, any warmth and/or heat for the cool side of the thermoelectric generator will typically flow from the thermoelectric generator into the cover.

The cover may comprise a plurality of fins to increase the surface area of the cover. The plurality of fins typically extend substantially perpendicular to the first and/or second planar faces of the support.

Alternatively the cover may comprise a series of grooves to increase the surface area of the cover. The series of grooves may be circumferential. The series of grooves typically extend parallel to the first and/or second planar faces of the support. The series of grooves may further comprise a corresponding series of ridges.

In use, it may be useful to increase the surface area of the cover so that the temperature of the cover can be reduced to and/or maintained at close to the temperature of the surrounding environment. The surrounding environment may be sea water.

There may be a gap between the cover and the support. The at least one thermoelectric generator may occupy the gap. The gap may also be filled with a fluid and/or sealed from the surrounding environment. The fluid may be an oil. The gap may be referred to as a void. In use, the fluid may help to insulate, typically electrically insulate, the thermoelectric generator. When the fluid is an electrically insulative fluid, the fluid may prevent an electrical short circuit in the apparatus for generating electricity.

In use, the fluid may help to protect the thermoelectric generator from the effects of increased pressure caused by the surrounding environment, especially when the surrounding environment is sea water and the apparatus is located subsea. The fluid may be at least substantially incompressible.

In use, the apparatus may be located subsea and/or at or near the seabed. The sea water may be up to 3000 meters deep and may be deeper.

It may be an advantage that the present invention has no moving parts because this increases the reliability of the apparatus and reduces any maintenance required. It may be advantageous if the apparatus can survive and therefore be operational for the entire production life of the hydrocarbon asset, comprising the pipe the apparatus is attached to, without requiring any maintenance.

The apparatus may be part of a larger system comprising a plurality of apparatus. The apparatus of the system may be discrete or connected together. The system may comprise at least one electrical connector and typically at least two electrical connectors between each apparatus. The at least one electrical connector may be a wet mate connector. In an alternative embodiment the at least one electrical connector may be a dry mate connector. The apparatus may be connected together using the at least one electrical connector to form an electrical circuit. The electrical circuit may further comprise one or more of a resistor, diode and transistor. The electrical circuit may be part of a Wireless Sensory Network (WSN).

The apparatus of the present invention may provide one or more of the following advantages, including a reduction in the number of infrastructure hubs required for basin development, a high level of overall safety, low construction and operation costs, unlimited expansion and/or tie-back possibilities and a mitigation of the need for high voltage connectors, inverters and/or cables.

An embodiment of the invention will now be described by way of example only and with reference to the accompanying drawings, in which.

Figure 1:
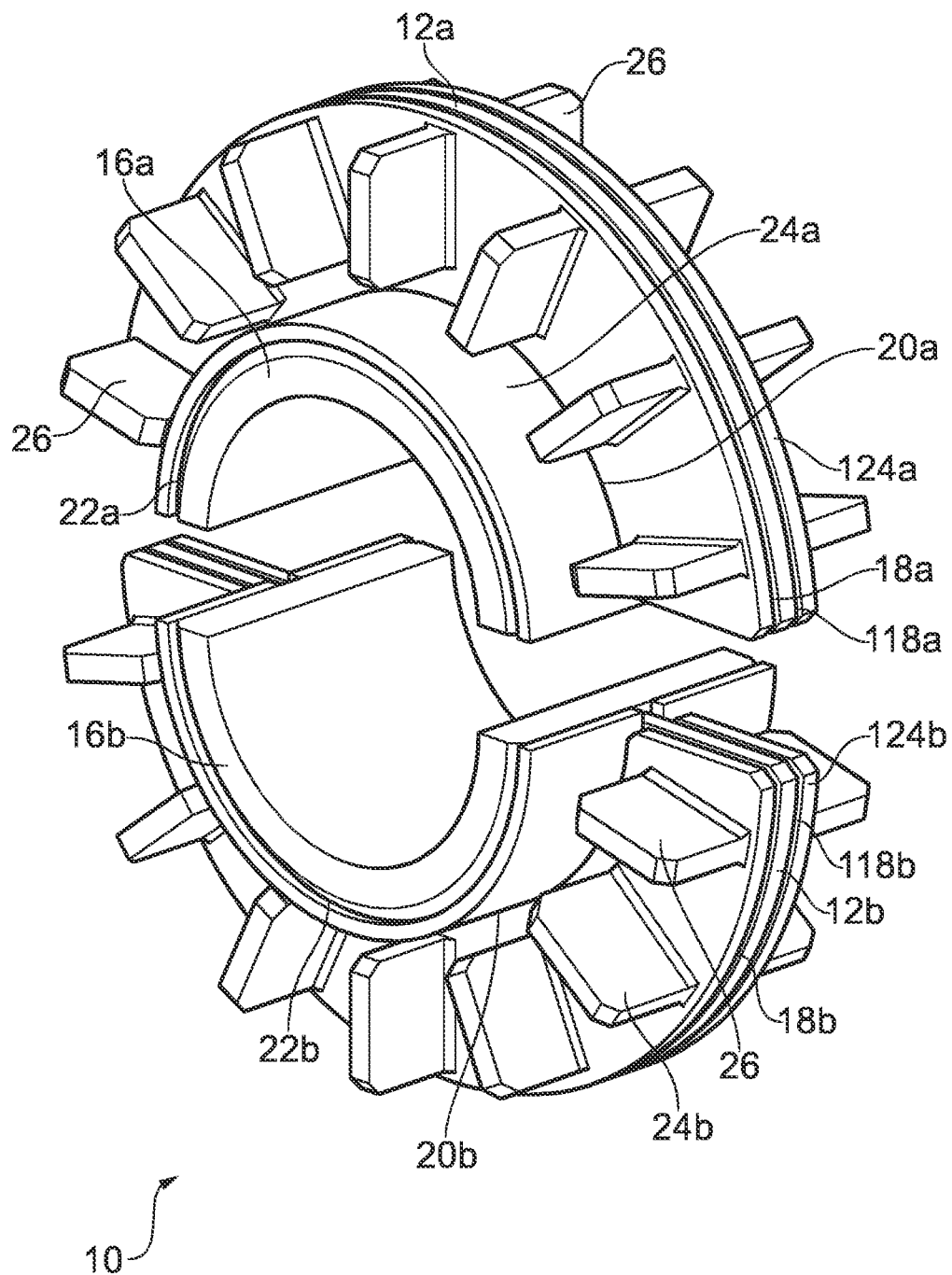
FIG. 1 is a perspective view of an apparatus for generating electricity.

FIG. 1 shows an apparatus 10 for generating electricity. The apparatus 10 has supports 12a & 12b having first planar faces (14a & 14b shown in FIG. 2) and collars 16a & 16b attached to the supports 12a & 12b respectively. The supports 12a & 12b are attached to the collars 16a & 16b such that they project away from the collars. A thermoelectric generator 18a is attached to the first planar face (14a shown in FIG. 2) of the support 12a and a second thermoelectric generator 18b is attached to the first planar face (14b shown in FIG. 2) of the support 12b. The first planar faces (14a & 14b shown in FIG. 2) of the supports 12a & 12b are upstanding from and perpendicular to the collars 16a & 16b. In use, the collars 16a & 16b are attached and/or coupled to an exterior surface of a pipe (not shown).

The thermoelectric generators 18a & 18b are flat and are shown installed on the flat planar faces (14a & 14b shown in FIG. 2) of the supports 12a & 12b. The supports 12a & 12b have an inner circumferential edge 20a & 20b. The collars 16a & 16b are welded to the inner circumferential edges 20a & 20b of the supports 12a & 12b.

In use, the pipe (not shown) is used for the transportation of fluid (not shown). The fluid is produced fluid or re-injected fluid. The temperature of the fluid in the pipe is 80° C. The pipe is located subsea, near the sea bed. The temperature of the sea water surrounding the apparatus is 5° C.

The collars 16a & 16b effectively increase the heat transfer surface area of the pipe. The apparatus 10 is in contact with the pipe (not shown). In use, heat from an outer surface of the pipe is transferred, largely by conduction, to the collars 16a & 16b and then from the collars 16a & 16b to the supports 12a & 12b.

When connected together the supports 12a & 12b make up a hollow disk. In use, the apparatus 10 surrounds a portion of pipe (not shown) that the collars 16a & 16b are attached to. The supports 12a & 12b are welded to the collars 16a & 16b respectively.

In an alternative arrangement the supports 12a & 12b and collars 16a & 16b are formed as a single piece.

The apparatus 10 is rigid. The collars 16a & 16b and supports 12a & 12b are made of steel.

There is a layer of thermal insulation 22a & 22b on an outer surface of the collars 16a & 16b. In use, the thermal insulation 22a & 22b reduces the loss or transfer of heat away from the collars 16a & 16b. Instead, the heat from the outer surface of the pipe is transferred to the collars 16a & 16b and then directed from the collars 16a & 16b to the supports 12a & 12b, rather than being transferred from the collars 16a & 16b to the surrounding environment.

The supports 12a & 12b also have a second planar face (not shown). Thermoelectric generators 118a & 118b are attached to the second planar face of the supports 12a & 12b.

Covers 24a & 24b and 124a & 124b are attached to the thermoelectric generators 18a & 18b and 118a & 118b respectively. The covers 24a & 24b and 124a & 124b have a plurality of fins 26 to increase the surface area of the covers. The fins 26 extend perpendicular to the first and second planar faces of the supports 12a & 12b. Increasing the surface area of the covers 24a & 24b and 124a & 124b helps to maintain the temperature of the covers 24a & 24b and 124a & 124b at or close to the temperature of the surrounding sea water (not shown).

The gaps (not shown) are between the covers 24a & 24b and 124a & 124b and thermoelectric generators 18a & 18b and 118a & 118b. The gaps are filled with oil and sealed from the surrounding environment. The oil is effectively incompressible such that it protects the thermoelectric generators 18a & 18b and 118a & 118b from the pressure of the sea water when the apparatus is located subsea.

Figure 2:
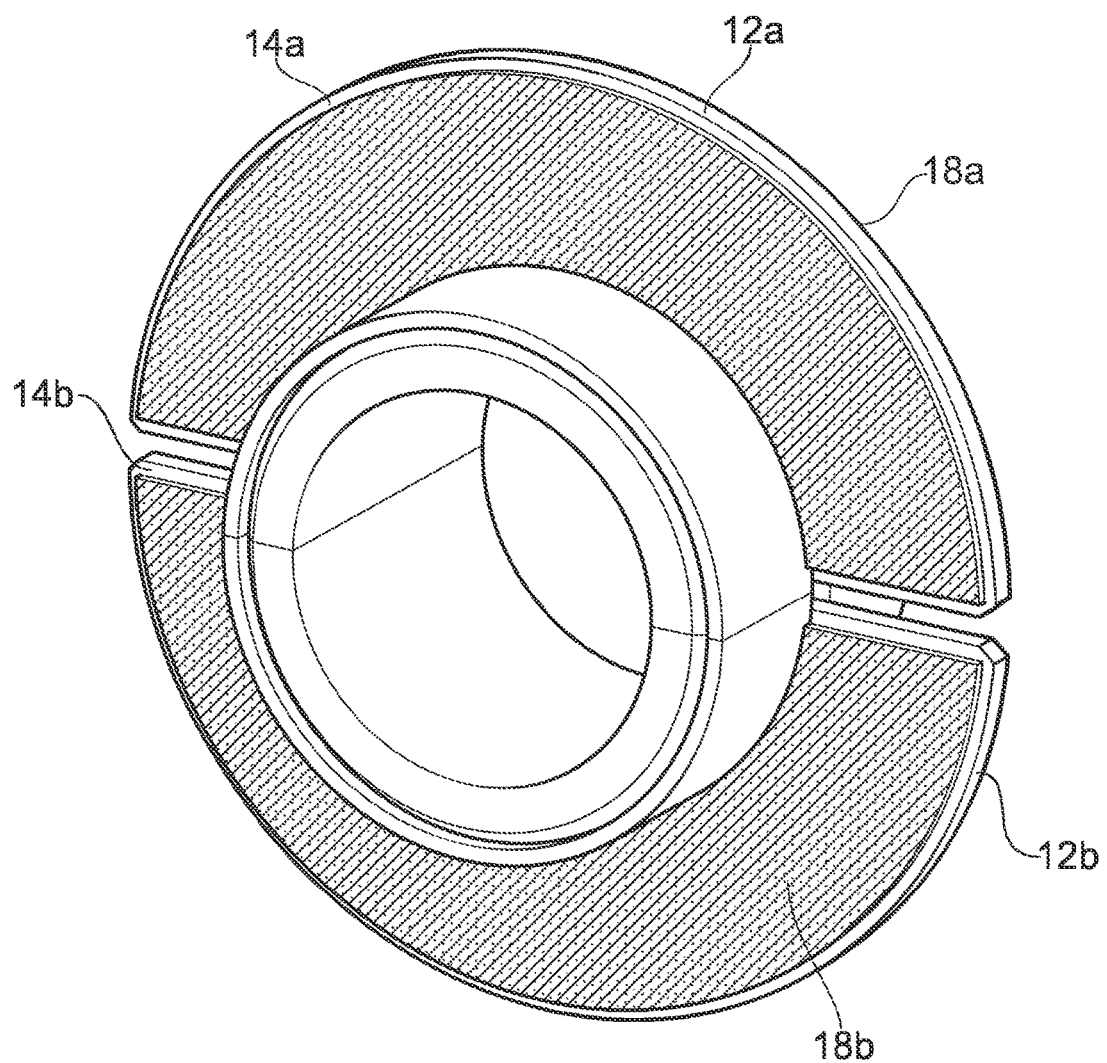
FIG. 2 is a perspective view of the support and thermoelectric generator.

FIG. 2 shows the supports 12a & 12b and thermoelectric generators 18a & 18b attached to the first planar faces 14a & 14b. The thermoelectric generators 18a & 18b and 118a & 118b are Seebeck generators.

The thermoelectric generators 18a & 18b (and 118a & 118b shown in FIG. 1) use a temperature difference to generate electricity. To generate electricity there is a thermal gradient across the thermoelectric generators 18a & 18b (and 118a & 118b shown in FIG. 1). The supports 12a & 12b and first planar faces 14a & 14b provide a flat interface with a high thermal gradient. In use, a first side of the thermoelectric generators 18a & 18b attached to the supports 12a & 12b is relatively warm. A second opposed side of the thermoelectric generators 18a & 18b is exposed to the surrounding environment and is relatively cool.

The heat for the warm side of the thermoelectric generators 18a & 18b is provided by the produced fluid in the pipe (not shown). The cooling for the cool side of the thermoelectric generators 18a & 18b is provided by sea water surrounding the apparatus 10.

As a specific example, the specific heat of produced fluid, in this case crude oil, in the pipe (not shown) is 1,982 J/kg·K, the mass of 1 barrel is 138.8 kg, the wellhead temperature is 80° C., the sea temperature at 120 meters is 5° C. and production is 10,000 bopd (barrels of oil per day). The thermal waste is therefore 2.4 MW and the power that can be generated at 10% efficiency is ca. 240 kW.

Figure 3:
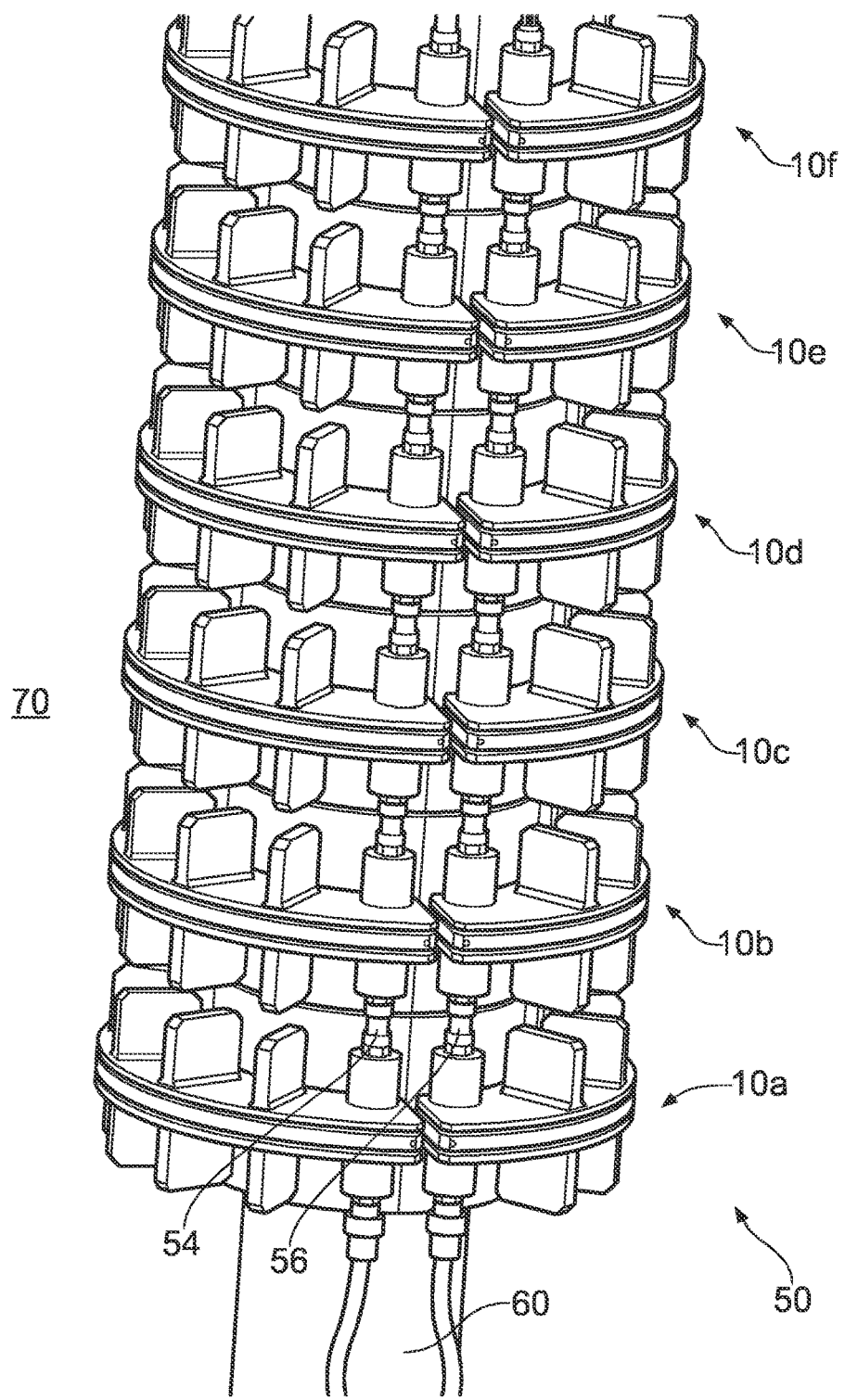
FIG. 3 is a perspective view of a system including a plurality of apparatus for generating electricity.

FIG. 3 shows a system 50 including a plurality of apparatus 10a to 10f for generating electricity.

The apparatus 10a to 10f of the system 50 are connected together. The system 50 includes two electrical connectors 54 and 56 between each apparatus 10a to 10f. The electrical connectors are wet mate connectors. The apparatus 10a to 10f are connected together to form an electrical circuit (not shown).

The system 50 of the present invention is used to provide electrical power to a flow meter, valve, pump, coalescer, acoustic modem, other control system and/or an instrument on a subsea Christmas tree.

When installed and in use, the system 50 including the pipe 60 is on the seabed at a depth of 120 m. Electricity can be generated when the temperature of the produced fluid in the pipe 60 is higher than the temperature of the sea water 70 surrounding the system 50. In use, the temperature of the produced fluid in the pipe 60 is 80° C. and the temperature of the surrounding sea water 70 is significantly less at 5° C. The apparatus 10a to 10f of the system 50 convert the temperature difference between the pipe 60 and the sea water 70 into electricity using the thermal gradient across the apparatus 10a to 10f.

Modifications and improvements can be incorporated herein without departing from the scope of the invention.

The invention claimed is:

1. An apparatus for generating electricity, the apparatus comprising:
   a collar arranged to be coupled to a pipe, the collar having a first portion and a second portion, wherein the first portion and the second portion each comprise a semi-annular interface and first and second ends, wherein the semi-annular interfaces of the first and second portions circumscribe at least a portion of the circumference of the pipe, the first ends of each portion are separable and disposable adjacent each other around the pipe, and the second ends of each portion are separable and disposable adjacent each other around the pipe;

a first support having a first planar face, the first support extending radially outwardly from an outer radial surface of the first portion of the collar;

a second support having a first planar face, the second support extending radially outwardly from an outer radial surface of the second portion of the collar;

at least one first thermoelectric generator attached to the first planar face of the first support;

at least one second thermoelectric generator attached to the first planar face of the second support;

a first cover attached to the at least one first thermoelectric generator and protects the at least one first thermoelectric generator from an outside environment, the first cover comprising a planar face and having a first end and a second end, the planar face of the first cover lying in a plane that is parallel to a plane that includes the first planar face of the first support, the first end of the first cover being adjacent the first end of the first portion of the collar, and the second end of the first cover being adjacent the second end of the first portion of the collar; and a second cover attached to the at least one second thermoelectric generator and protects the at least one second thermoelectric generator from the outside environment, the second cover comprising a planar face and having a first end and a second end, the planar face of the second cover lying in a plane that is parallel to a plane that includes the first planar face of the second support, the first end of the second cover being adjacent the first end of the second portion of the collar, and the second end of the second cover being adjacent the second end of the second portion of the collar, and wherein the first ends of each cover are separable and disposable adjacent each other around the pipe, and the second ends of each cover are separable and disposable adjacent each other around the pipe.

2. An apparatus as claimed in claim 1, wherein the first support is attached to the first portion of the collar such that the first planar face of the first support extends substantially perpendicular to the first portion of the collar, and the second support is attached to the second portion of the collar such that the first planar face of the second support extends substantially perpendicular to the second portion of the collar.

3. An apparatus as claimed in claim 1, wherein the first portion of the collar is attached to an inner circumferential edge of the first support, and the second portion of the collar is attached to an inner circumferential edge of the second support.

4. An apparatus as claimed in claim 1, wherein a temperature difference between a fluid flowing within the pipe and the environment surrounding the apparatus is from 0 to 400° C.

5. An apparatus as claimed in claim 4, wherein the environment surrounding the apparatus is sea water.

6. An apparatus as claimed in claim 1, wherein the first support and the second support are each semi-disk shaped.

7. An apparatus as claimed in claim 1, wherein the first and second portions of the collar are hinged, welded, bolted or pinned together.

8. An apparatus as claimed in claim 1, wherein the size and shape of the first portion and the second portion of the collar are matched to the size and shape of the pipe.

9. An apparatus as claimed in claim 1, wherein the apparatus further comprises a layer of thermal insulation on an outer surface of the collar.

10. An apparatus as claimed in claim 1, wherein each of the first support and the second support further comprises a second planar face, and wherein at least one third thermoelectric generator is attached to the second planar face of the first support and at least one fourth thermoelectric generator is attached to the second planar face of the second support.

11. An apparatus as claimed in claim 1, wherein the thermoelectric generator is a Seebeck generator.

12. An apparatus as claimed in claim 1, wherein the first and second supports and collar are made of a material that has a thermal conductivity of from 20 to 500 $Wm^{-1} K^{-1}$.

13. An apparatus as claimed in claim 1, wherein the first cover and the second cover each comprise a plurality of fins to increase the surface area of the first cover and the second cover.

14. An apparatus as claimed in claim 1, wherein the first cover and the second cover each comprise a series of grooves to increase the surface area of the first cover and the second cover.

15. An apparatus according to claim 1, wherein the first cover and the first support define a first gap therebetween, the at least one first thermoelectric generator occupying the first gap, and wherein the second cover and the second support define a second gap therebetween, the at least one second thermoelectric generator occupying the second gap.

16. An apparatus as claimed in claim 15, wherein the first gap and the second gap are filled with a fluid.

* * * * *